Figure 2:
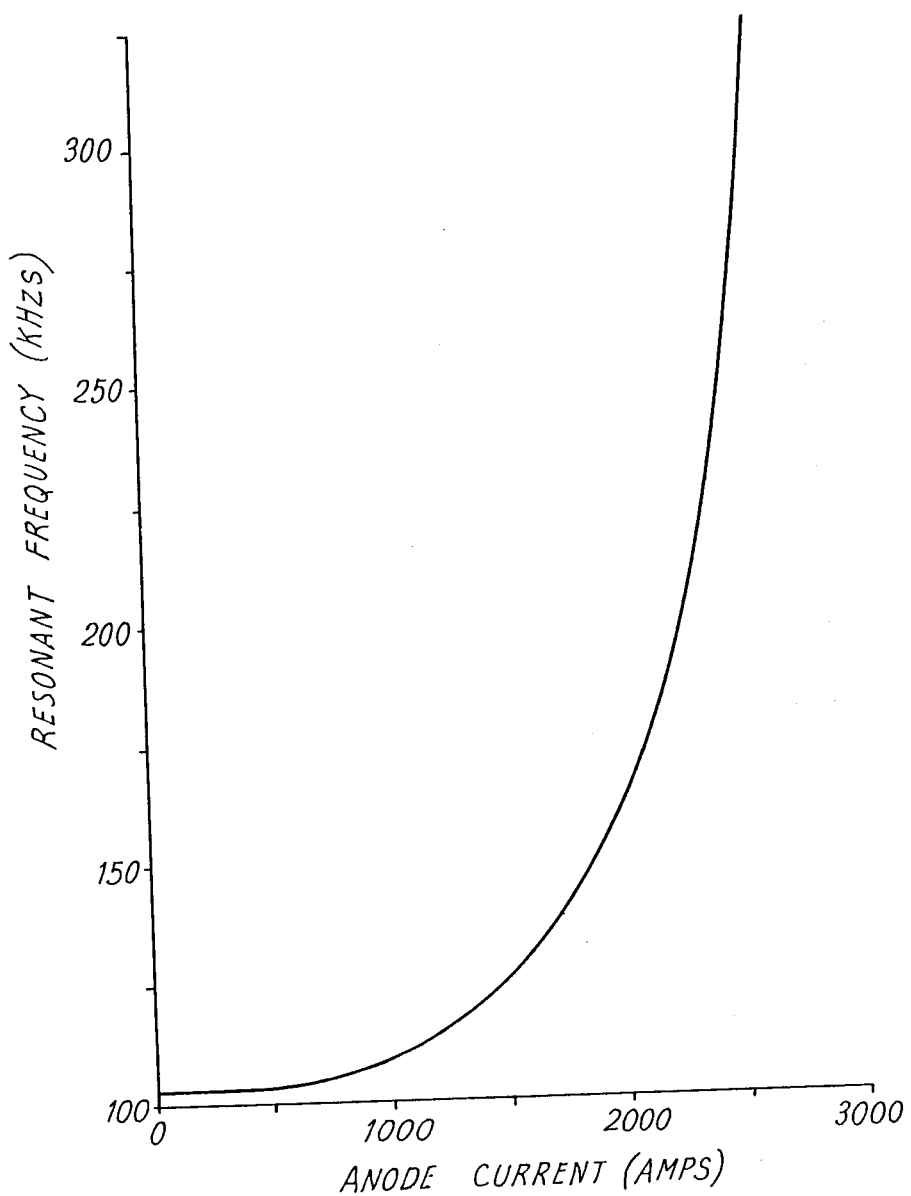

United States Patent [19]
Barrault

[11] 4,030,998
[45] June 21, 1977

[54] ANODE ADJUSTMENT

[75] Inventor: Michel Raymond Barrault, Hoylake, England

[73] Assignee: Imperial Chemical Industries Limited, London, England

[22] Filed: Aug. 4, 1975

[21] Appl. No.: 601,497

[30] Foreign Application Priority Data
Aug. 16, 1974 United Kingdom ............ 36166/74

[52] U.S. Cl. .............................. 204/219; 204/228
[51] Int. Cl.² ..................... C25D 21/12; C25C 7/06
[58] Field of Search .................. 204/228, 219, 225

[56] References Cited
UNITED STATES PATENTS

| 3,574,073 | 4/1971 | Ralston, Jr. | 204/228 |
| 3,723,285 | 3/1973 | Daga et al. | 204/219 |
| 3,763,024 | 10/1973 | Engelmann et al. | 204/219 |
| 3,853,723 | 12/1974 | Mack | 204/219 |
| 3,926,750 | 12/1975 | Adachi | 204/228 |

Primary Examiner—T. M. Tufariello
Attorney, Agent, or Firm—Cushman, Darby & Cushman

[57] ABSTRACT

An apparatus for detecting the variation from a predetermined value of the current flowing in any one of a set of electrical conductors which comprises a plurality of saturable resonant circuit devices arranged in a network, each device being associated with a conductor, and wherein the network is connected to a means for measuring changes in resonance frequency of one or more of said devices.

The apparatus is especially applicable for the detection of short circuits in electrolytic cells having a flowing mercury cathode, for example in cells for the manufacture of chlorine and sodium hydroxide by electrolyzing sodium chloride brine.

6 Claims, 2 Drawing Figures

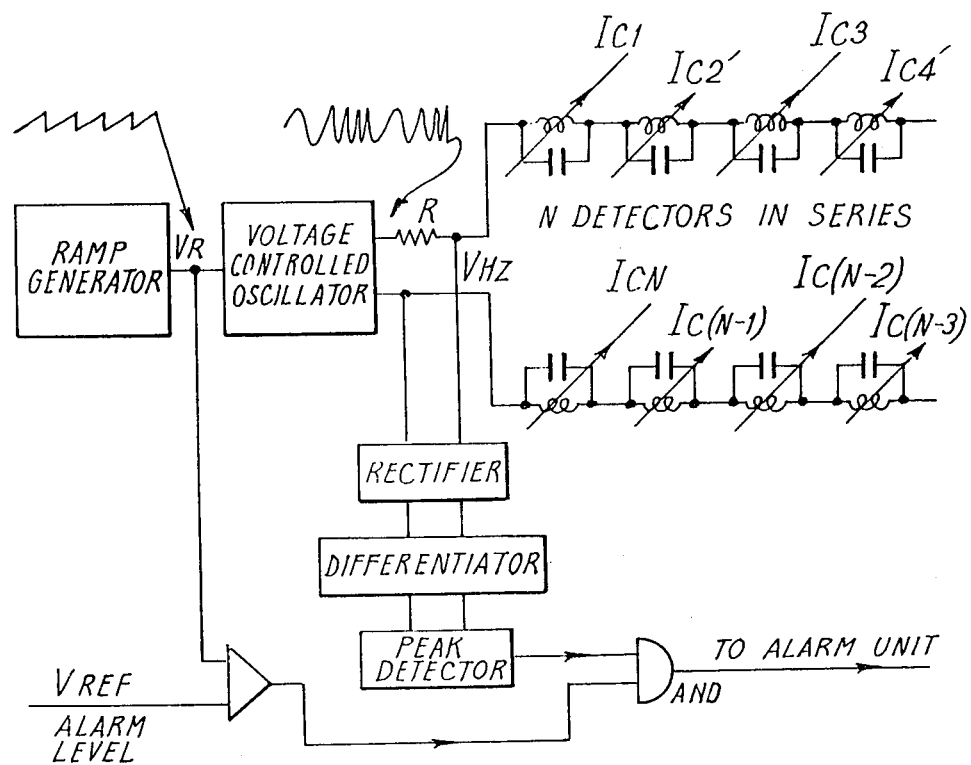
FIG.1
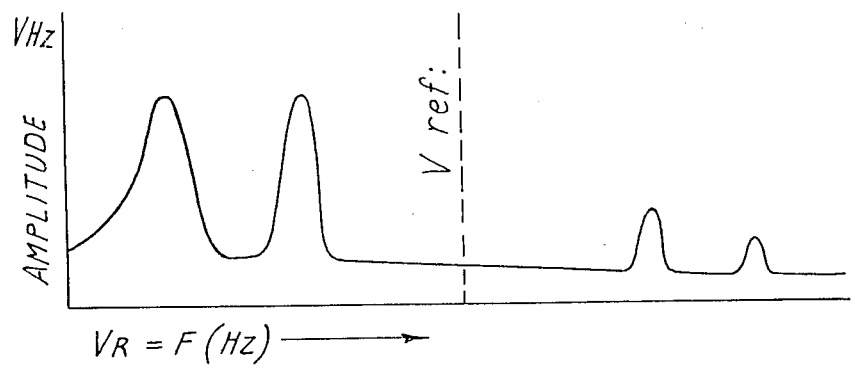

ANODE ADJUSTMENT

The present invention relates to the detection of variations in current in direct carrying conductors, in particular variations from a normal current, either to larger or smaller currents, in a network of direct current carrying conductors. More particularly it relates to an apparatus for detecting electrical short circuits in electrolytic cells and to means of adjusting the position of anodes in response to said detection of short circuits.

In recent years it has been proposed to replace the graphite rods which have long been used to carry the electrolysing current through the cell cover to the anodes in mercury-cathode cells electrolysing brine by metal rods, especially when the anode is itself a substantially metallic structure, e.g. a foraminate titanium structure carrying an electrocatalytic coating. The metal current lead-in rod, which also supports the anode in the cell, is most suitably made of copper or Aluminium and is protected from corrosion by a sheath of porcelain, ebonite or a corrosion-resistant metal such as titanium. A flexible end of the bus-bar feeding current to the anode is attached to the current lead-in rod at or near its upper end, and a metal suspension rod depending from a support which is rigidly connected to the cell cover supports the upper end of the lead-in rod so that the anode is set at the desired distance from the mercury cathode.

Electrical shorting arises chiefly from fluctuations in mercury level within the cell, but whatever the casual mechanism, the shorting will cause the anode to pass a higher current. Apart from interfering with electrolysis, a high short-circuit current can rapidly damage the anode.

We have now found a reliable means of indicating short circuits which is based on the use of saturable resonant circuit to detect changes in current.

According to the present invention we provide a means for detecting the variation from a predetermined value of the current flowing in any one of a set of electrical conductors which comprises a plurality of saturable resonant circuit devices arranged in a network, each device being associated with a conductor, and wherein the network is connected to a means for measuring changes in resonance frequency of one or more of said devices.

The resonant circuit devices each comprise a fixed capacitor and a saturable inductor made up of a coil wound on a ferromagnetic core. As saturation of the coil is approached, the permeability of the ferromagnetic material is controlled by the strength of the magnetic field set up by the current being carried by the conductor. When the strength of the external magnetic field reaches a value which saturates the ferromagnetic core, the resonant frequency of this resonant circuit changes more rapidly with increasing field. In this way the resonant frequency of each of the resonant circuits is made a function of the current (designated as Ic in this specification) being carried by their associated conductors.

The resonant circuit devices may be arranged in a variety of ways to form the network including (1) parallel resonant devices connected in series (2) series resonant devices connected in parallel (3) resonant devices connected in '$\pi$' or 'T' ladder network configuration.

The invention is applicable to the detection of variations in current such as occur in the current leads to any electrical apparatus in which a large number of currents have to be monitored. Suitable applications include electrical apparatus for distributing DC power (for example distributing DC power to heating appliances or power operated machines), and further applications include a wide range of electrolytic apparatus, for example aluminium cells, electroplating and in diaphragm or mercury electrolytic cells. It is especially applicable to the detection of short circuits in electrolytic cells having a flowing mercury cathode.

According to a further aspect of the present invention we provide in combination with an electrolytic cell having a substantially horizontal flowing mercury cathode and metal anodes suspended on current lead-in rods which pass in vertically adjustable manner through the cell cover, an apparatus for detecting electrical shorting of the anode and the mercury cathode by detecting the variation from a predetermined value of the current flowing in any one of the current lead-in rods which comprises a plurality of saturable resonant circuit devices arranged in a network, each device being attached to or arranged near a current lead-in rod, and wherein the network is connected to a means for measuring changes in resonance frequency of one or more of said devices.

In a preferred embodiment of the invention, the apparatus for detecting electrical shorting of the anode and the mercury cathode is combined with a means for retracting an anode in response to the aforesaid variations in current lead-in rod which occur during shorting.

The output from the apparatus for detecting electrical shorting can be used to actuate the means for retracting the anodes using a conventional relay or thyristor power amplifier.

The means for retracting the anodes suitably comprises a mechanical assembly which is raised or lowered by a linear actuator powered by an AC motor.

The invention is especially applicable for use in mercury cathode cells for the manufacture of chlorine and an alkali metal hydroxide by the electrolysis of an aqueous solution of an alkali metal chloride, for example the manufacuture of chlorine and sodium hydroxide by the electrolysis of sodium chloride brine.

An embodiment of the invention is illustrated in FIG. 1. A number of detectors forming parallel resonant circuits are connected in series and supplied by a signal which is fed from a voltage controlled oscillator. The oscillator output voltage, $V_{HZ}$, sweeps through a range of frequencies repetitively and as the various detectors resonate, peaks occur in the amplitude of $V_{HZ}$. The frequency at which a detector resonates is a function of the current carried by its associated conductor, ie the higher the current the higher the resonant frequency. The voltage signal fed from the ramp generator, $V_R$, is directly proportional to the frequency of $V_{HZ}$. This is compared with a reference voltage, $V_{Ref}$ which represents a predetermined alarm level for the currents in the conductors. If a peak occurs in the oscillator voltage, $V_{HZ}$, when $V_R$ exceeds $V_{Ref}$, the 'And' gate operates and an alarm signal is given and/or a retraction device is actuated.

The invention is illustrated but not limited by the following Examples.

EXAMPLE 1

To illustrate this device as a single unit a resonant circuit device, comprising a fixed capacitor (0.068 microfarads) connected in parallel with an inductor wound on a ferromagnetic core, was fixed to a current carrying conductor, consisting of a cylindrical copper bar 38 mm diameter through which a variable current could be passed. The frequency at which resonance occured was recorded as a function of current and is illustrated in FIG. 2. It is to be noticed that at the operating currents for a bar of this cross section, viz 1000 – 1300 amp, there is little change in resonant frequency. At about twice the normal current the rate of change of frequency of resonance with current increases very rapidly and a resonant frequency of 175 kHz is recorded at a current of about 2100 amp.

EXAMPLE 2

On a section of a mercury cathode cell for the production of chlorine by the electrolysis of sodium chloride brine comprising a group of 16 titanium anodes, each copper current lead in rod (one per anode) was fitted with a resonant circuit device as described in Example 1. The devices were connected in series across a signal generator providing a 175 kHz sinusoidal voltage. For the purpose of demonstration, individual anodes were adjusted manually and the critical currents were recorded at which the resonant frequencies of the corresponding device within the circuit reached the set value of 175 kHz. These currents were all in the range 2000 to 3000 amp. Thus the resonant frequency devices when connected as in FIG. 1 provide a signal which can be used for initiating emergency retraction of the anodes and/or an alarm device at a current level which is above the normal operating current but well below a current which could damage the anode structure.

What we claim is:

1. In combination with an electrolytic cell having a substantially horizontal flowing mercury cathode and metal anodes suspended on current lead-in rods which pass in vertically adjustable manner through the cell cover, an apparatus for detecting electrical shorting of the anode and the mercury cathode by detecting the variation from a predetermined value of the current flowing in any one of the current lead-in rods which comprises a plurality of saturable resonant circuit devices arranged in a network, each device comprising a fixed capacitor and a saturable inductor including a coil wound on a ferromagnetic core which is arranged near a current lead-in rod so that the permeability of the ferromagnetic core is controlled by the current being carried by the lead-in rod whereby the resonant frequency of the device is a function of said current and changes rapidly with increasing field, and wherein the network is connected to a means for measuring changes in resonance frequency of one or more of said devices.

2. Apparatus as claimed in claim 1 wherein the network comprises parallel resonant devices connected in series.

3. Apparatus as in claim 1 wherein the network comprises series resonant devices connected in parallel.

4. Apparatus as in claim 1 wherein the network comprises resonant devices connected in $\pi$ configuration.

5. Apparatus as in claim 1 wherein the network comprises resonsant devices connected in T ladder network configuration.

6. In combination with an electrolytic cell having a substantially horizontal flowing mercury cathode and metal anodes suspended on current lead-in rods which pass in vertically adjustable manner through the cell cover, an apparatus for detecting electrical shorting of the anode and the mercury cathode by detecting the variation from a predetermined value of the current flowing in any one of the current lead-in rods which comprises a plurality of saturable resonant circuit devices arranged in network, each device comprising a fixed capacitor and a saturable inductor including a coil wound on a ferromagnetic core which is arranged near a current lead-in rod so that the permeability of the ferromagnetic core is controlled by the current being carried by the lead-in rod whereby the resonant frequency of the device is a function of said current and changes rapidly with increasing field, an oscillator which sweeps through a range of output voltage frequencies repetitively, circuit means for applying the oscillator output voltages to said resonant circuit devices, said network being connected to a means for measuring changes in resonance frequency of one or more of said devices, said measuring means including means for generating a voltage signal having a magnitude directly proportional to the frequency of the oscillator output and means for comparing said voltage signal with a reference voltage.

* * * * *